United States Patent
Noda

(10) Patent No.: US 8,735,861 B2
(45) Date of Patent: May 27, 2014

(54) SEMICONDUCTOR STORAGE DEVICE AND METHOD OF MANUFACTURING SAME

(71) Applicant: Kabushiki Kaisha Toshiba, Tokyo (JP)

(72) Inventor: Kotaro Noda, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/777,052

(22) Filed: Feb. 26, 2013

(65) Prior Publication Data

US 2014/0061566 A1 Mar. 6, 2014

Related U.S. Application Data

(60) Provisional application No. 61/695,778, filed on Aug. 31, 2012.

(51) Int. Cl.
*H01L 29/02* (2006.01)

(52) U.S. Cl.
USPC ............. 257/2; 257/3; 257/4; 257/E45.002; 438/128; 438/382; 438/570; 438/694

(58) Field of Classification Search
CPC ............ H01L 27/0688; H01L 45/1675; H01L 27/2481; H01L 45/144
USPC ........... 257/2–5, E45.001, E45.002; 438/128, 438/382, 570, 694, 478
See application file for complete search history.

(56) References Cited

U.S. PATENT DOCUMENTS

| | | | |
|---|---|---|---|
| 8,115,245 B2 | 2/2012 | Yoshimizu et al. | |
| 8,263,455 B2 | 9/2012 | Park et al. | |
| 8,309,958 B2 | 11/2012 | Hirota et al. | |
| 2010/0006812 A1 | 1/2010 | Xu et al. | |
| 2011/0193049 A1 | 8/2011 | Iwakaji et al. | |
| 2013/0248804 A1 | 9/2013 | Kawai | |

FOREIGN PATENT DOCUMENTS

| | | |
|---|---|---|
| JP | 2010-80685 | 4/2010 |
| JP | 2011-103323 | 5/2011 |
| JP | 2011-114344 | 6/2011 |
| JP | 2011-165854 | 8/2011 |
| JP | 2011-192866 | 9/2011 |
| JP | 2011-527834 | 11/2011 |
| JP | 2013-197461 | 9/2013 |

OTHER PUBLICATIONS

U.S. Appl. No. 13/601,353, filed Aug. 31, 2012, Murato Kawai.

*Primary Examiner* — Mark A Laurenzi
(74) *Attorney, Agent, or Firm* — Oblon, Spivak, McClelland, Maier & Neustadt, L.L.P.

(57) ABSTRACT

A semiconductor storage device according to an embodiment includes a first conductive layer, a variable resistance layer, an electrode layer, a first liner layer, a stopper layer, and a second conductive layer. The first liner layer is configured by a material having a property for canceling an influence of an orientation of a lower layer of the first liner layer, the property of the first liner layer being superior compared with that of the stopper layer. The stopper layer is acted upon by an internal stress in a compressive direction at room temperature.

5 Claims, 10 Drawing Sheets

SEMICONDUCTOR STORAGE DEVICE AND METHOD OF MANUFACTURING SAME

CROSS-REFERENCE TO RELATED APPLICATIONS

This application is based upon and claims the benefit of U.S. Provisional Patent Application No. 61/695,778, filed on Aug. 31, 2012, the entire contents of which are incorporated herein by reference.

FIELD

Embodiments described herein relate to a semiconductor storage device and a method of manufacturing the same.

BACKGROUND

Description of the Related Art

Nowadays, electrically rewritable resistance change memories, such as a ReRAM and a PRAM, attract attention as a semiconductor storage device. A memory cell of the resistance change memory is configured to be able to change a resistance value, and data is stored in the resistance change memory by the change of the resistance value. The resistance change memory is provided between a word line and a bit line.

However, sometimes, in a manufacturing process of the above-mentioned ReRAM, a buckling phenomenon occurs in a line-and-space pattern, causing a word line or a bit line to short-circuit.

DETAILED DESCRIPTION

A semiconductor storage device according to an embodiment includes a first conductive layer, a variable resistance layer, an electrode layer, a first liner layer, a stopper layer, and a second conductive layer. The variable resistance layer is provided above the first conductive layer. The electrode layer contacts an upper surface of the variable resistance layer. The first liner layer contacts an upper surface of the electrode layer. The stopper layer contacts an upper surface of the first liner layer. The second conductive layer is provided above the stopper layer. The first liner layer is configured by a material having a property for canceling an influence of an orientation of a lower layer of the first liner layer, the property of the first liner layer being superior compared with that of the stopper layer. The stopper layer is acted upon by an internal stress in a compressive direction at room temperature.

Hereinafter, a semiconductor storage device according to the embodiment will be described with reference to the drawings.

First Embodiment

Configuration

[Overall Configuration]

Figure 1:
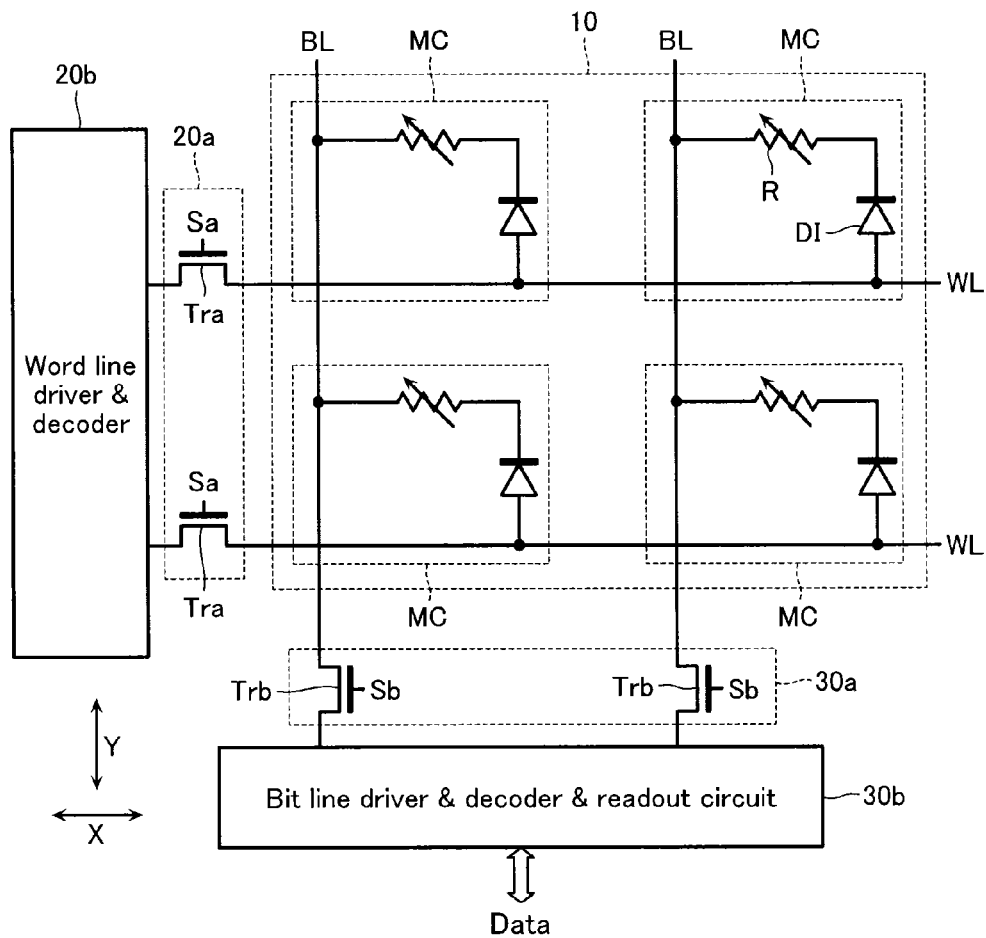
FIG. 1 is a circuit diagram of a semiconductor storage device according to a first embodiment.

A circuit configuration of a semiconductor storage device according to a first embodiment will be described below with reference to FIG. 1. Referring to FIG. 1, the semiconductor storage device of the first embodiment includes a memory cell array 10, a word line selector circuit 20a, a word line driver circuit 20b, a bit line selector circuit 30a, and a bit line driver circuit 30b.

The memory cell array 10 includes word lines WL and bit lines BL, which intersect each other, and memory cells MC each disposed in an intersection of the word line WL and the bit line BL. The word lines WL are arrayed in a Y-direction at predetermined intervals, and extend in an X-direction. The bit lines BL are arrayed in the X-direction at predetermined intervals, and extend in the Y-direction. That is, the memory cells MC are arranged in a matrix form on a surface formed in the X-direction and the Y-direction.

The memory cell MC includes a diode DI and a variable resistance element R as illustrated in FIG. 1. An anode of the diode DI is connected to the word line WL, and a cathode is connected to one end of the variable resistance element R. The variable resistance element R is electrically rewritable, and stores data in a nonvolatile manner based on a resistance value. The other end of the variable resistance element R is connected to the bit line BL.

The word line selector circuit 20a includes plural selection transistors Tra as illustrated in FIG. 1. One end of the selection transistor Tra is connected to one end of the word line WL, and the other end of the selection transistor Tra is connected to the word line driver circuit 20b. A signal Sa is supplied to a gate of the selection transistor Tra. That is, the word line selector circuit 20a controls the signal Sa, thereby selectively connecting the word line WL to the word line driver circuit 20b.

As illustrated in FIG. 1, the word line driver circuit 20b applies a voltage, which is necessary to erase the data from the memory cell MC, write the data in the memory cell MC, and read the data from the memory cell MC, to the word line WL.

As illustrated in FIG. 1, the bit line selector circuit 30a includes plural selection transistors Trb. One end of the selection transistor Trb is connected to one end of the bit line BL, and the other end of the selection transistor Trb is connected to the bit line driver circuit 30b. A signal Sb is supplied to the gate of the selection transistor Trb. That is, the bit line selector circuit 30a controls the signal Sb, thereby selectively connecting the bit line BL to the bit line driver circuit 30b.

As illustrated in FIG. 1, the bit line driver circuit 30b applies the voltage, which is necessary to erase the data from the memory cell MC, write the data in the memory cell MC, and read the data from the memory cell MC, to the bit line BL. The bit line driver circuit 30b externally outputs the data read from the bit line BL.

[Memory Cell Array]

Figure 2:
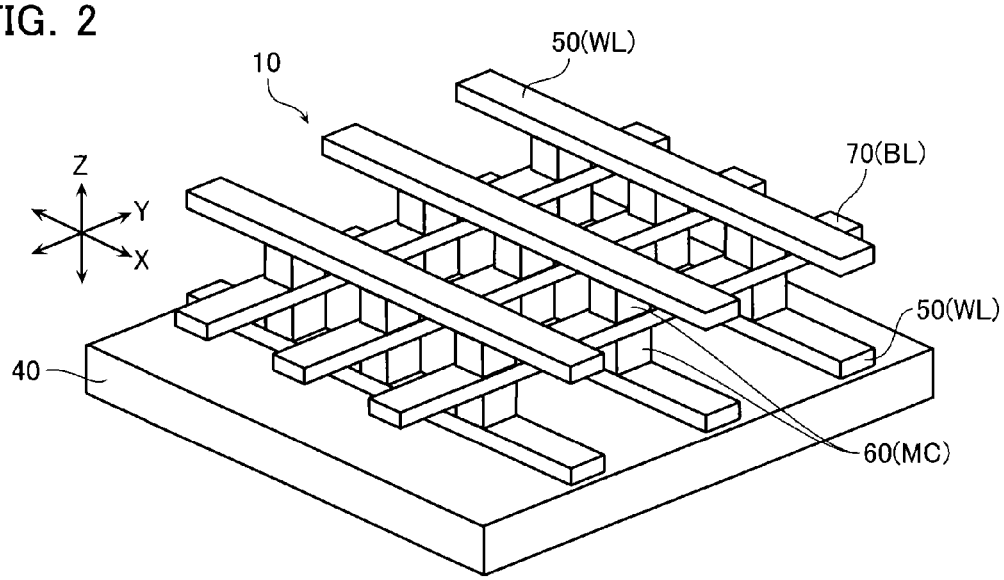
FIG. 2 is a schematic perspective view of a memory cell array 10 according to the first embodiment.

Next, a stacked structure of the memory cell array 10 of the first embodiment will be described below with reference to FIG. 2. Referring to FIG. 2, the memory cell array 10 is formed above a substrate 40. The memory cell array 10 includes a first conductive layer 50, a memory layer 60, a second conductive layer 70, a memory layer 60, and a first conductive layer 50 from the lower layer toward an upper layer. That is, one second conductive layer 70 is shared by two memory layers 60 located above and below the second conductive layer 70. The first conductive layer 50 acts as the word line WL. The memory layer 60 acts as the memory cell MC. The second conductive layer 70 acts as the bit line BL.

As illustrated in FIG. 2, the first conductive layers 50 are formed into a stripe shape extending in the X-direction while arrayed in the Y-direction at predetermined intervals. Desirably the first conductive layer 50 is made of a material having a heat-resistant property and a low resistance. For example, the first conductive layer 50 is made of tungsten (W), titanium (Ti), tantalum (Ta), a nitride thereof, or a stacked structure thereof.

As illustrated in FIG. 2, each of the memory layers 60 is provided between the first conductive layer 50 and the second conductive layer 70, and the memory layers 60 are arranged in a matrix form in the X-direction and the Y-direction.

As illustrated in FIG. 2, the second conductive layers 70 are formed into the stripe shape extending in the Y-direction while arrayed in the X-direction at predetermined intervals to come into contact with the upper surfaces of the memory layers 60. Desirably the second conductive layer 70 is made of a material having the heat-resistant property and the low resistance. For example, the second conductive layer 70 is made of tungsten (W), titanium (Ti), tantalum (Ta), a nitride thereof, or a stacked structure thereof.

Figure 3:
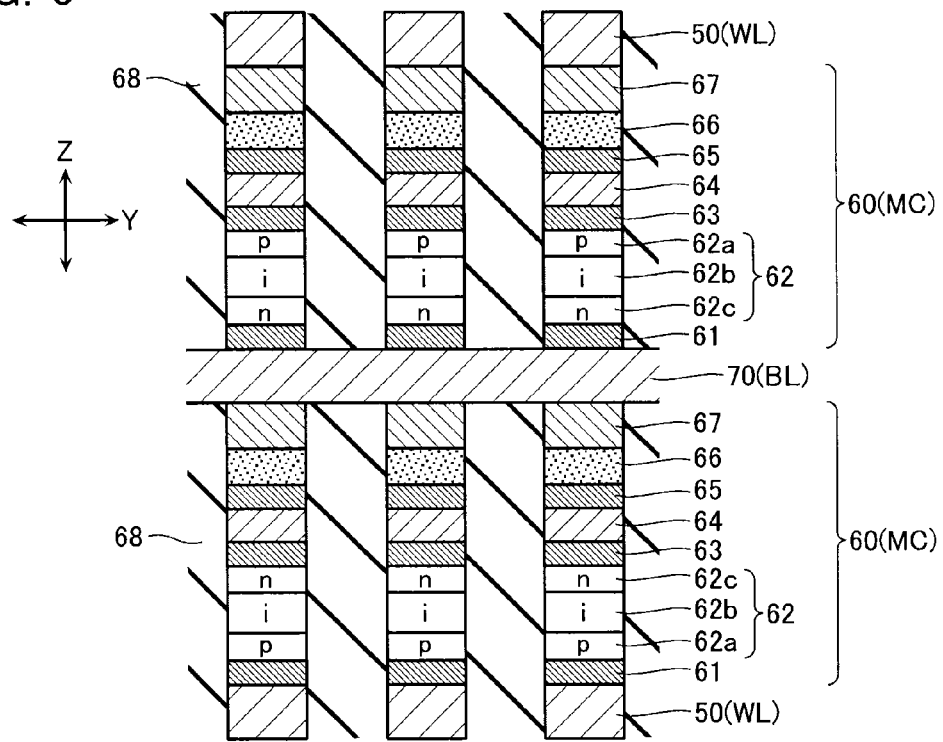
FIG. 3 is a sectional view illustrating a memory layer 60 according to the first embodiment.

Next, the detailed stacked structure of the memory layer 60 will be described below with reference to FIG. 3. FIG. 3 is a sectional view illustrating the memory layer 60. Referring to FIG. 3, the memory layer 60 includes a barrier metal layer 61, a diode layer 62, a lower electrode layer 63, a variable resistance layer 64, an upper electrode layer 65, a liner layer 66, a stopper layer 67, and an inter-layer insulator 68.

The barrier metal layer 61 contacts an upper surface of the first conductive layer 50. The barrier metal layer 61 is made of titanium nitride (TiN).

The diode layer 62 contacts an upper surface of the barrier metal layer 61. The diode layer 62 acts as the diode DI. The diode layer 62 is made of polysilicon. The diode layer 62 includes a p-type semiconductor layer 62a, an intrinsic semiconductor layer 62b, and an n-type semiconductor layer 62c. The stacking order of the p-type semiconductor layer 62a, the intrinsic semiconductor layer 62b, and the n-type semiconductor layer 62c is inverted in the upper layer and the lower layer of the second conductive layer 70.

The lower electrode layer 63 contacts an upper surface of the diode layer 62. The lower electrode layer 63 is made of titanium nitride (TiN). Alternatively, the lower electrode layer 63 may be made of Pt, Au, Ag, TiAlN, SrRuO, Ru, RuN, IR, Co, Ti, TaN, LaNiO, Al, PtIrOx, PtRhOx, Rh, or TaAlN.

The variable resistance layer 64 contacts an upper surface of the lower electrode layer 63. The variable resistance layer 64 acts as the variable resistance element R. In the variable resistance layer 64, the resistance value is changed depending on at least one of an applied voltage, a passed current, and an injected charge. For example, the variable resistance layer 64 is made of a metal oxide.

The upper electrode layer 65 contacts an upper surface of the variable resistance layer 64. The upper electrode layer 65 is made of the same material as the lower electrode layer 63.

The liner layer 66 contacts an upper surface of the upper electrode layer 65. The liner layer 66 is configured such that, compared with the stopper layer 67, an orientation of a lower layer of the liner layer 66 has no influence on an orientation of an upper layer of the liner layer 66. In other words, the liner layer 66 is made of a material that has a property for canceling the influence of the orientation of the lower layer of the liner layer 66, the property being superior compared with the stopper layer 67. For example, the liner layer 66 is made of amorphous silicon (amorphous-Si), or tungsten silicide (WSi).

The stopper layer 67 contacts an upper surface of the liner layer 66. An etching rate of the stopper layer 67 by Chemical Mechanical Polishing (CMP) is smaller than an etching rate of the inter-layer insulator 68 by the CMP. For example, the stopper layer 67 is made of tungsten (W). Moreover, as mentioned later, the stopper 67 is formed having a thermal expansion coefficient larger than those of the upper electrode layer 65 and the liner layer 66. Since film formation of the liner layer 66 is performed under high temperature, an internal stress acts on the liner layer 66 in a direction of contraction (hereinafter, mentioned as "compressive direction") at room temperature.

The inter-layer insulator 68 contacts the first interconnection layer 50, a side surface of the memory layer 60, and the second conductive layer 70. For example, the inter-layer insulator 68 is made of silicon oxide ($SiO_2$).

[Method of Manufacturing]

[Outline]

Known as a method of manufacturing a memory cell array including a variable resistance element is a method where materials configuring the memory cell array are stacked sequentially on a substrate to form a line-and-space pattern. Each layer of a stacked body formed in the line-and-space shape undergoes film formation under high temperature; also, each layer of the stacked body is configured from a different material, respectively, hence has a different thermal expansion coefficient. Therefore, each layer of the above-described stacked body is acted upon by an internal stress in a direction of contraction or a direction of expansion at room temperature. Below, a state where an internal stress acts in a direction of contraction is called a "tensile" state, and a state where an internal stress acts in a direction of expansion is called a "compressive" state.

Buckling may occur in the stacked body depending on magnitude of internal stress in the above-described stacking body, particularly on magnitude of internal stress in an uppermost layer of the stacked body. That is, when a case where the uppermost layer of the stacked body is in a "compressive" state and other layers are in a "tensile" state at room temperature is supposed, the upper most layer tends to expand relatively at room temperature, whereas the other layers tend to contract relatively. This results in the line-and-space pattern getting twisted. This causes short-circuiting between the stacked bodies configuring the line-and-space pattern, breaks in wiring in the uppermost layer, and so on.

On the other hand, in the case where the uppermost layer of the stacked body is in a "tensile" state at room temperature, the uppermost layer contracts along with contraction of the other layers, hence the above-described buckling does not occur. However, if the thermal expansion coefficient of the uppermost layer becomes too large, there is a risk of breaks in wiring occurring in the uppermost layer formed in lines.

In the present embodiment, the uppermost layer of the above-described stacked body is the stopper layer 67. Therefore, in order to prevent buckling of the stacked body, it is only required to configure the stopper layer 67 to be in a "tensile" state at room temperature. That is, it is only required to make the thermal expansion coefficient of the stopper layer 67 larger than the thermal expansion coefficient of the upper electrode layer 65, and so on. However, if tungsten employed as the stopper 67 is formed directly on the upper electrode layer 65, then effects of orientation of a material configuring the upper electrode layer 65, and so on, result in the stopper layer 67 being in a "compressive" state. Accordingly, in the present embodiment, the liner layer 66 is formed on the upper electrode 65. The liner layer 66 is configured from a material having a property for canceling an influence of an orientation of the upper electrode 65, compared to the stopper layer 67. In addition to the stopper layer 67 is deposited on the liner layer 66. This results in orientation of the stopper layer 67 being adjusted, and moreover the thermal expansion coefficient of the stopper layer 67 being adjusted.

Figure 4:
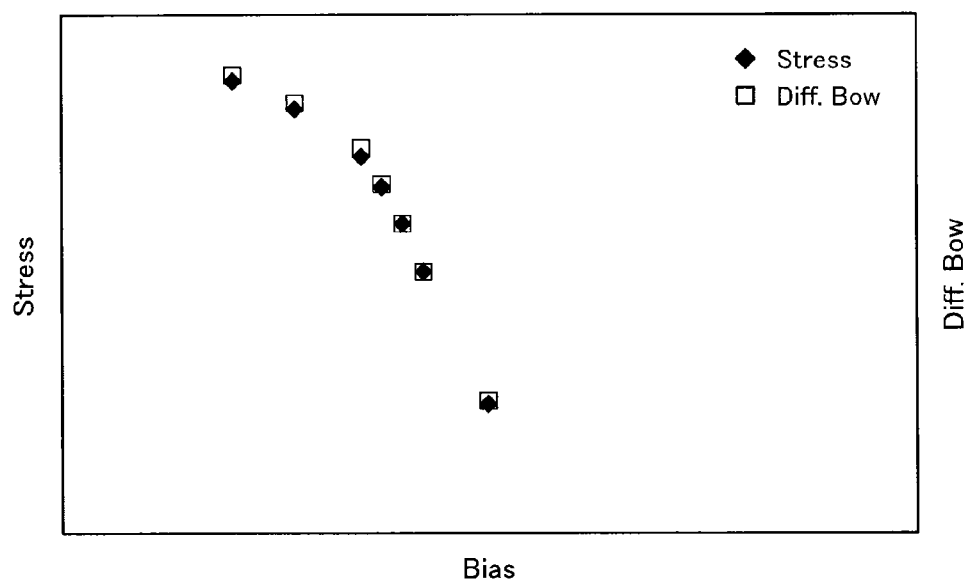
FIG. 4 is a view illustrating a correlative relationship between internal stress in a contraction direction and a bias value of sputtering, at room temperature, of a stopper layer 67 according to the first embodiment.

In addition, studies by the inventors have made clear that the lower a bias value of sputtering during film formation of the liner layer 66 or stopper layer 67, the larger the internal stress in the direction of contraction at room temperature of the liner layer 66 or the stopper layer 67. FIG. 4 is a graph illustrating a relationship between internal stress of the stacked body ("Stress" in FIG. 4) and buckling of the stacked body ("Diff. Bow" in FIG. 4), and bias of sputtering.

[Each of Manufacturing Processes]

Figure 5:
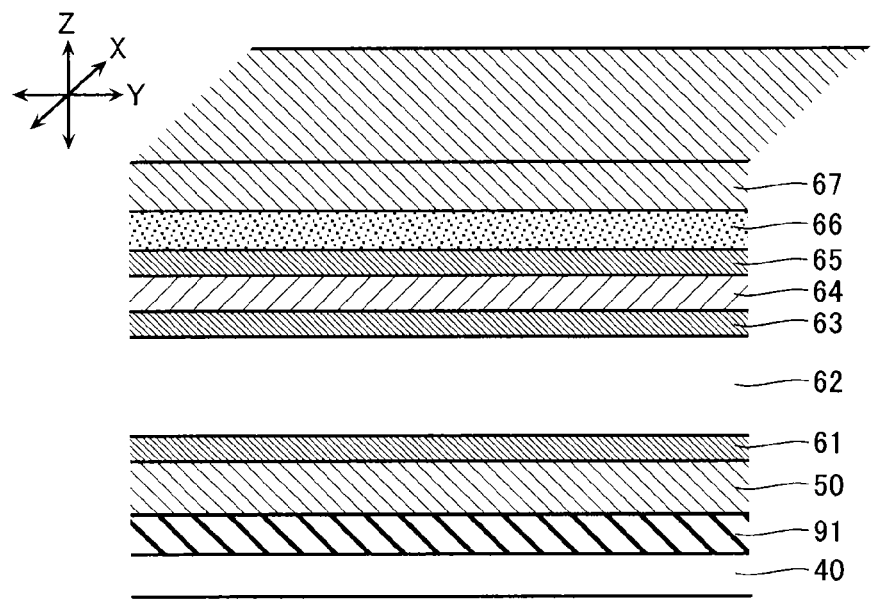
FIG. 5 is a sectional view of the semiconductor storage device in a manufacturing process according to the first embodiment.

A method of manufacturing the semiconductor storage device in the first embodiment will be described below with reference to FIGS. 5 to 11. As illustrated in FIG. 5, the first-conductive-layer-forming layer 50, the barrier-metal-layer-forming layer 61, the diode-layer-forming layer 62, the lower-electrode-layer-forming layer 63, the variable-resistance-layer-forming layer 64, the upper-electrode-layer-forming layer 65, the liner-layer-forming layer 66, and the stopper-layer-forming layer 67 are stacked on the substrate 40 via an insulating layer 91.

Specifically, tungsten (W) having a thickness of 50 nm is deposited by a sputtering method to form the first-conductive-layer-forming layer 50. The first-conductive-layer-forming layer 50 may have a stacked structure of tungsten (W) and tungsten nitride (WN). Titanium nitride (TiN) having the thickness of 5 nm is deposited by the sputtering method to form the barrier-metal-layer-forming layer 61. Amorphous silicon having the thickness of 85 nm is deposited by an LPCVD method to form the diode-layer-forming layer 62.

The diode-layer-forming layer 62 is formed by sequentially stacking a phosphorus-doped p-type semiconductor layer, an intrinsic semiconductor layer in which an impurity is not doped, and a boron-doped n-type semiconductor layer. A natural oxide layer formed on the surface of the diode-layer-forming layer 62 is removed by a wet treatment. The lower-electrode-layer-forming layer 63 is formed by depositing titanium nitride (TiN) by the sputtering method. The variable-resistance-layer-forming layer 64 is formed by the LPCVD method or the sputtering method. The upper-electrode-layer-forming layer 65 is formed by the sputtering method.

The liner-layer-forming layer 66 and the stopper-layer-forming layer 67 are formed by the sputtering method. Now, the orientation of the stopper-layer-forming layer 67 is adjustable by forming the liner-layer-forming layer 66. The orientation of the stopper-layer-forming layer 67 can be further adjusted by adjusting the bias of sputtering during formation of the liner-layer-forming layer 66 or the stopper-layer-forming layer 67. The bias value of sputtering may be adjusted such that internal stress at room temperature of the stopper-layer-forming layer 67 acts in the compressive direction. Such a bias value may be appropriately adjusted according to aspect ratio and so on of the stacked body after later-described etching.

Figure 6:
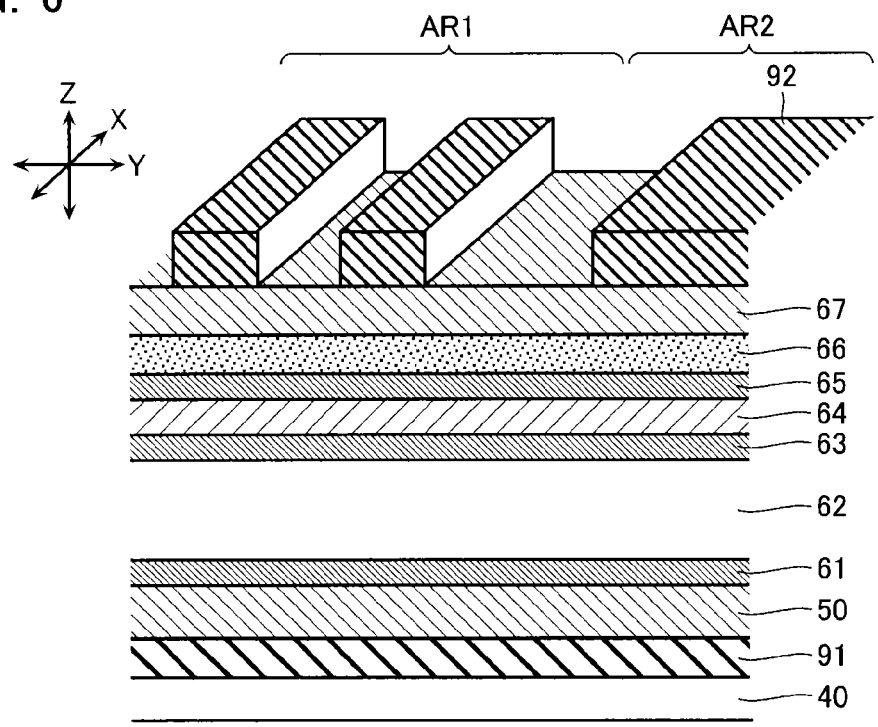
FIG. 6 is a sectional view of the semiconductor storage device in the manufacturing process according to the first embodiment.

As illustrated in FIG. 6, a hard mask 92 is formed on an upper surface of the stopper-layer-forming layer 67. d-TEOS having the thickness of 200 nm is deposited by a CVD method, and patterned by a lithography method, thereby forming the hard mask 92. In a memory area AR1 where the memory cell array 10 is formed, the hard masks 92 are formed into the strip shape extending in the X-direction while arrayed in the Y-direction at predetermined intervals. On the other hand, in a peripheral area AR2 located around the memory area AR1, the hard mask 92 is formed so as to cover the whole of the peripheral area AR2.

Figure 7:
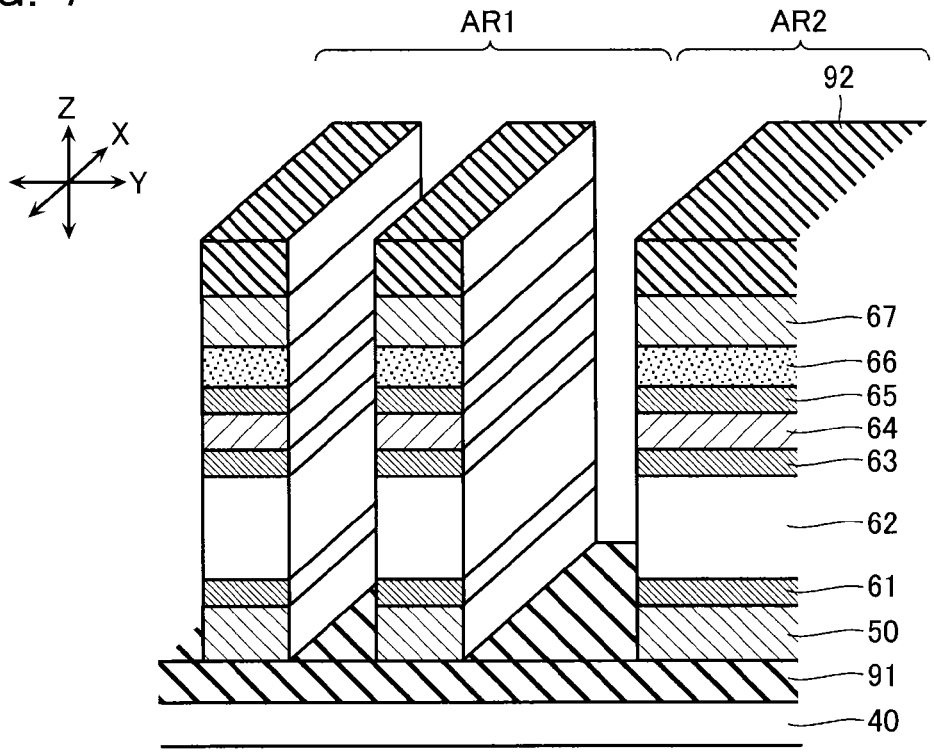
FIG. 7 is a sectional view of the semiconductor storage device in the manufacturing process according to the first embodiment.

As illustrated in FIG. 7, etching is performed to the first-conductive-layer-forming layer 50 through the hard mask 92 by an RIE method. Therefore, the first conductive layers 50, the barrier-metal-layer-forming layers 61, the diode-layer-forming layers 62, the lower-electrode-layer-forming layers 63, the variable-resistance-layer-forming layers 64, the upper-electrode-layer-forming layers 65, the liner-layer-forming layers 66, and the stopper-layer-forming layers 67 are formed into the stripe shape extending in the X-direction while arrayed in the Y-direction at predetermined intervals.

Figure 8:
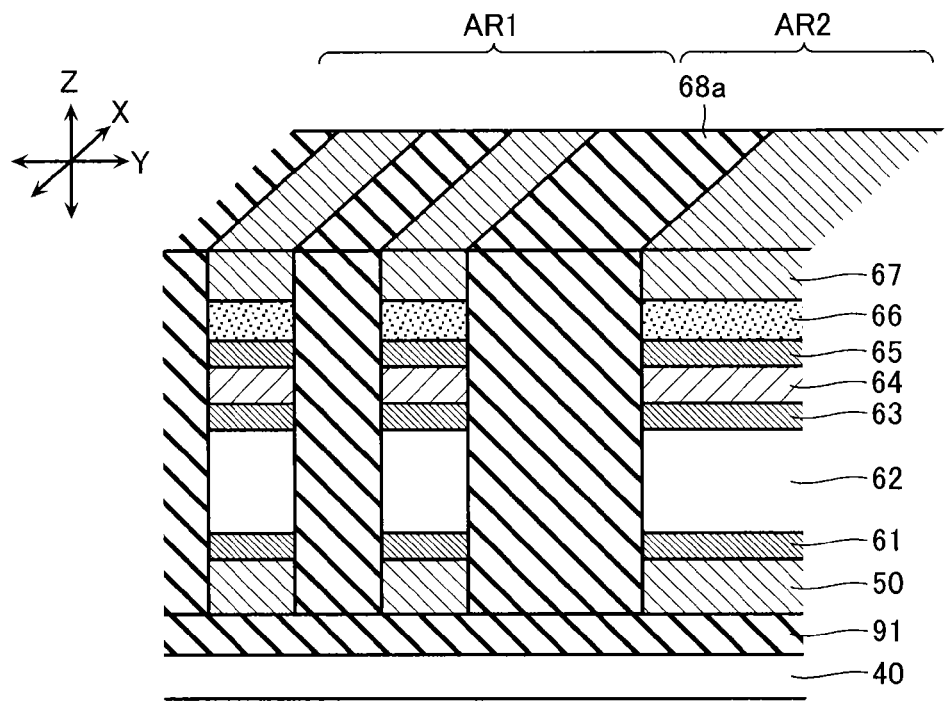
FIG. 8 is a sectional view of the semiconductor storage device in the manufacturing process according to the first embodiment.

As illustrated in FIG. 8, the inter-layer insulator 68a is formed so as to cover the hard mask 92 and the-stopper-layer-forming layers 67. Then, the hard mask 92 and the inter-layer insulator 68a are planarized until the upper surface of the stopper-layer-forming layers 67 are exposed by the CMP.

Figure 9:
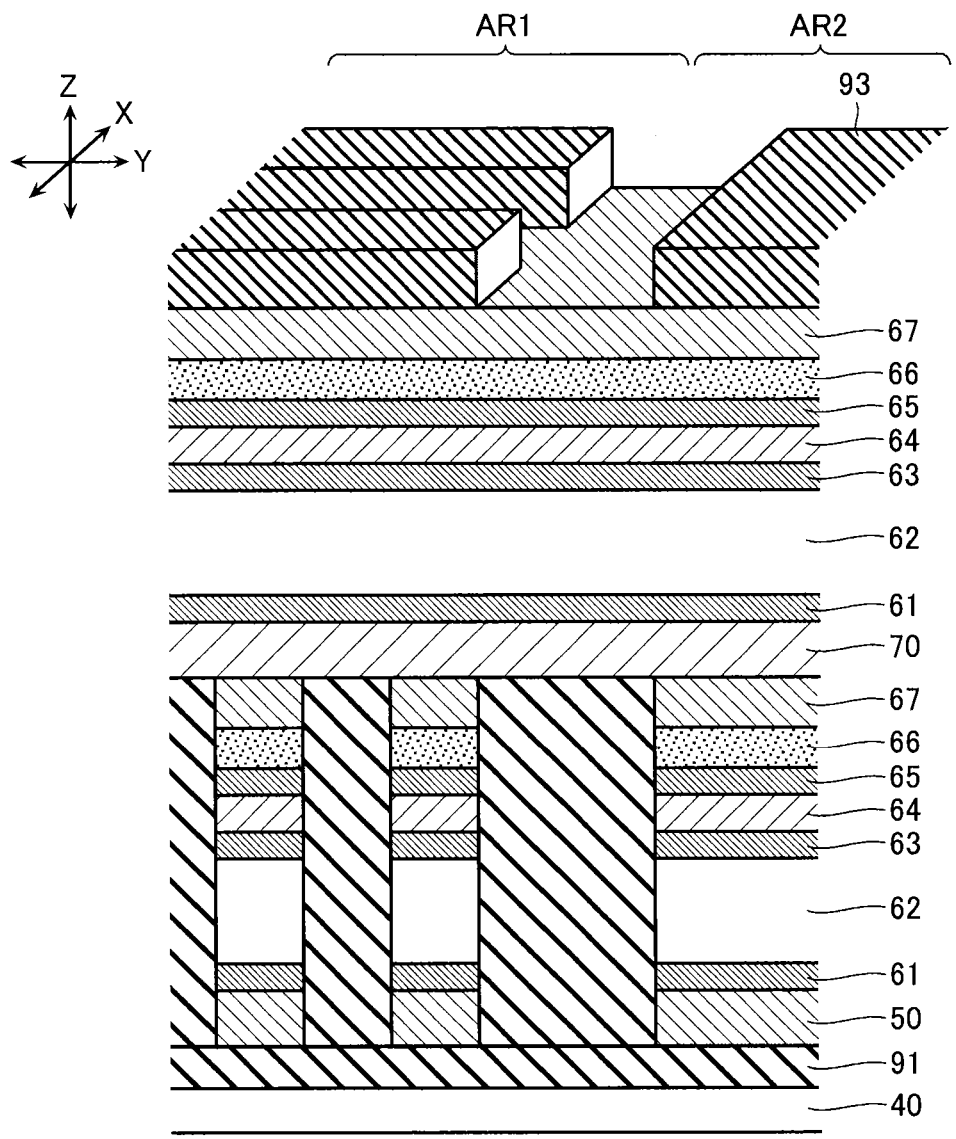
FIG. 9 is a sectional view of the semiconductor storage device in the manufacturing process according to the first embodiment.

As illustrated in FIG. 9, the second-conductive-layer-forming layer 70, the barrier-metal-layer-forming layer 61, the diode-layer-forming layer 62, the lower-electrode-layer-forming layer 63, the variable-resistance-layer-forming layer 64, the upper-electrode-layer-forming layer 65, the liner-layer-forming layer 66, and the stopper-layer-forming layer 67 are stacked on the stopper-layer-forming layers 67 and the inter-layer insulator 68a of the uppermost layer. At this point, the diode-layer-forming layer 62 is formed by sequentially stacking the n-type semiconductor layer, the intrinsic semiconductor layer, and the p-type semiconductor layer.

Note that the stopper-layer-forming layer 67 of the uppermost layer can also be formed similarly to the stopper-layer-forming layer 67 of the lowermost layer. In this case, each of the layers can also be formed to be in a more "tensile" state with respect to a lower layer as a layer becomes more upward.

Such a method is thought to enable occurrence of buckling of the stacked body to be more reliably reduced.

As illustrated in FIG. 9, a hard mask 93 is formed on the upper surface of the stopper-layer-forming layer 67. d-TEOS having the thickness of 200 nm is deposited by the CVD method, and patterned by the lithography method, thereby forming a hard mask 93. In the memory area AR1, the hard masks 93 are formed into the strip shape extending in the Y-direction while arrayed in the X-direction at predetermined intervals. On the other hand, in the peripheral area AR2, the hard mask 93 is formed so as to cover the whole of the peripheral area AR2.

Figure 10:
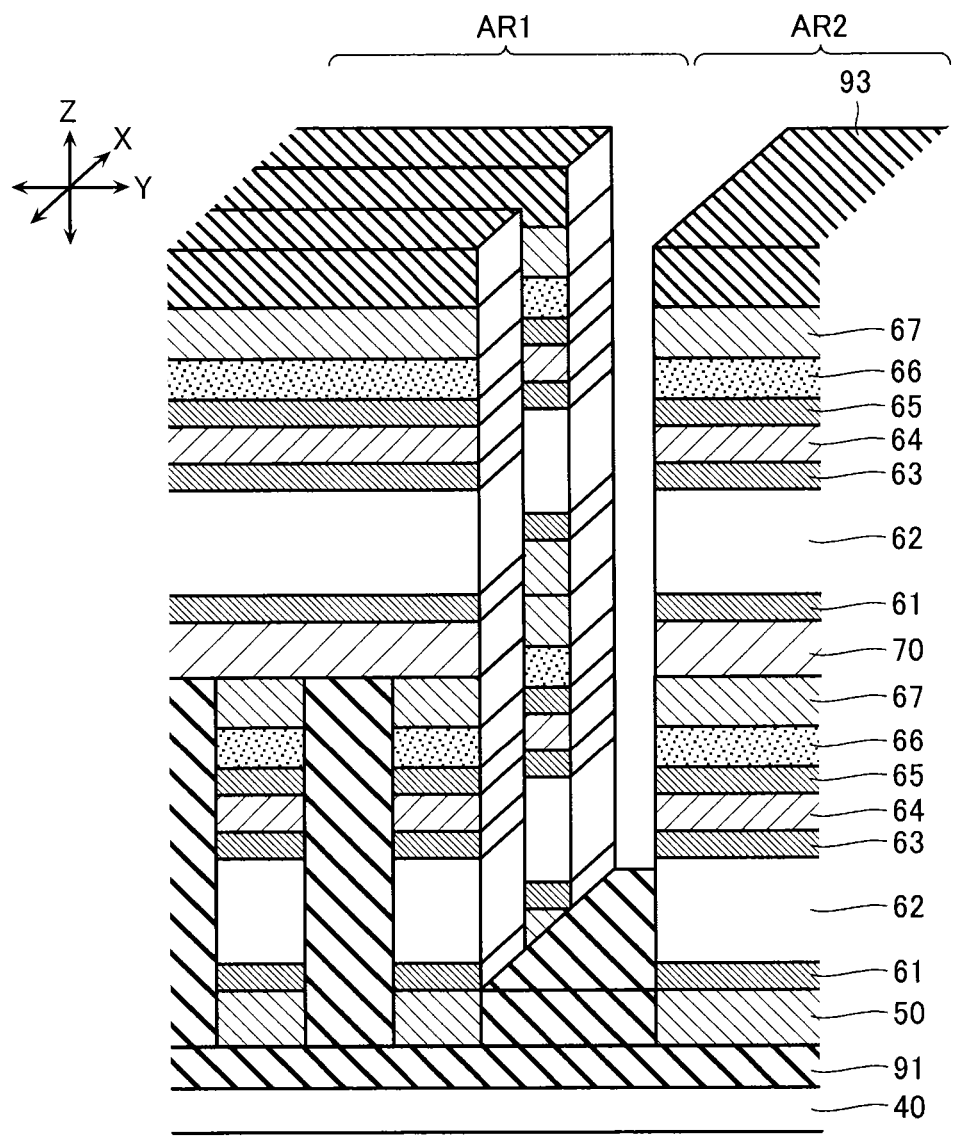
FIG. 10 is a sectional view of the semiconductor storage device in the manufacturing process according to the first embodiment.

As illustrated in FIG. 10, the etching is performed through the hard mask 93 until the barrier-metal-layer-forming layers 61 that contact the upper surface of the first conductive layers 50 are divided. Therefore, the barrier metal layers 61, the diode layers 62, the lower electrode layers 63, the variable resistance layers 64, the upper electrode layers 65, the liner layers 66, and the stopper layers 67 are formed so as to be arranged in a matrix form in the Y-direction and the X-direction at predetermined intervals in the lower layer of the second conductive layer 70. The second conductive layers 70 are formed into the stripe pattern extending in the Y-direction while arrayed in the X-direction at predetermined intervals. The barrier-metal-layer-forming layers 61, the diode-layer-forming layers 62, the lower-electrode-layer-forming layers 63, the variable-resistance-layer-forming layers 64, the upper-electrode-layer-forming layers 65, the liner-layer-forming layers 66, and the stopper-layer-forming layers 67 are formed into the stripe pattern extending in the Y-direction while arrayed in the X-direction at predetermined intervals in the upper layer of the second conductive layer 70.

Figure 11:
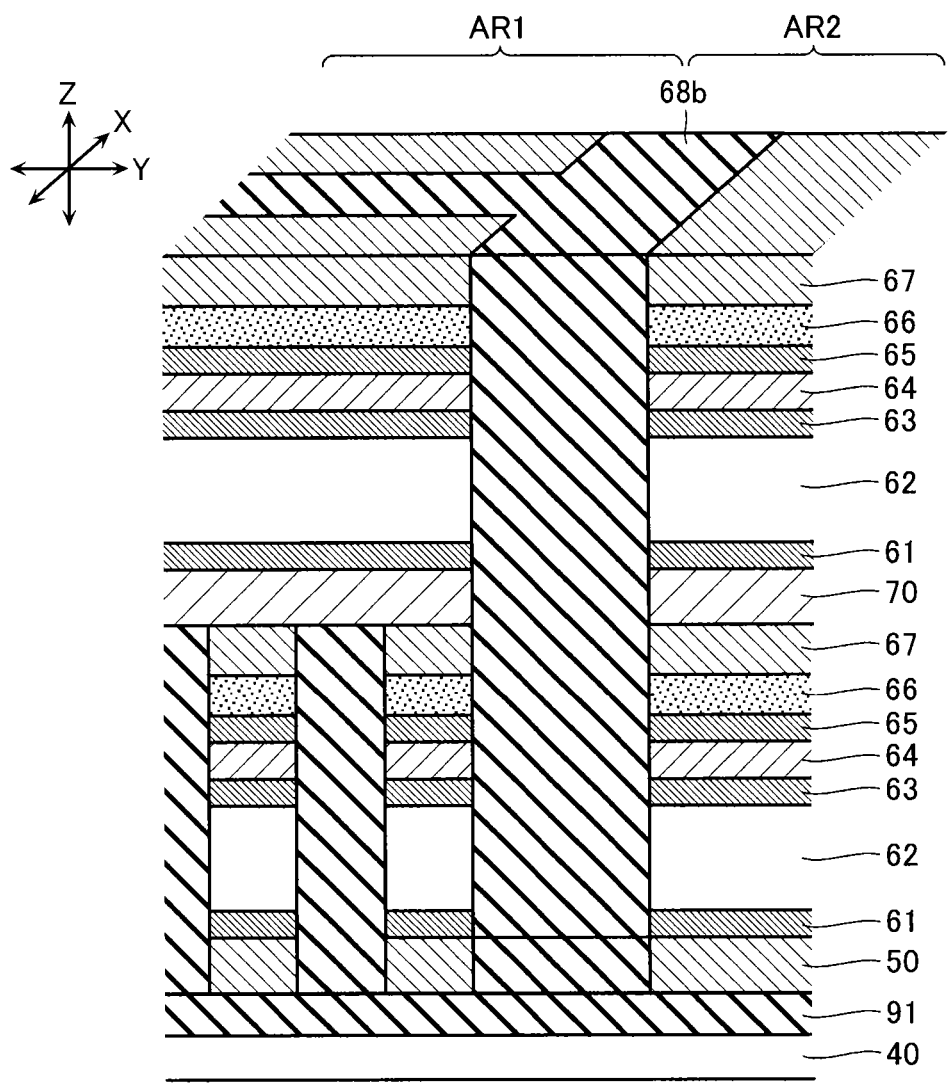
FIG. 11 is a sectional view of the semiconductor storage device in the manufacturing process according to the first embodiment.

As illustrated in FIG. 11, the inter-layer insulator 68b is formed so as to cover the hard mask 93 and the upper surface of the stopper-layer-forming layers 67 of the uppermost layer. Then, the hard mask 93 and the inter-layer insulator 68b are planarized until the upper surface of the stopper-layer-forming layers 67 are exposed by the CMP. Then, the same processes in FIGS. 5 to 11 are repeatedly performed.

Second Embodiment

Figure 12:
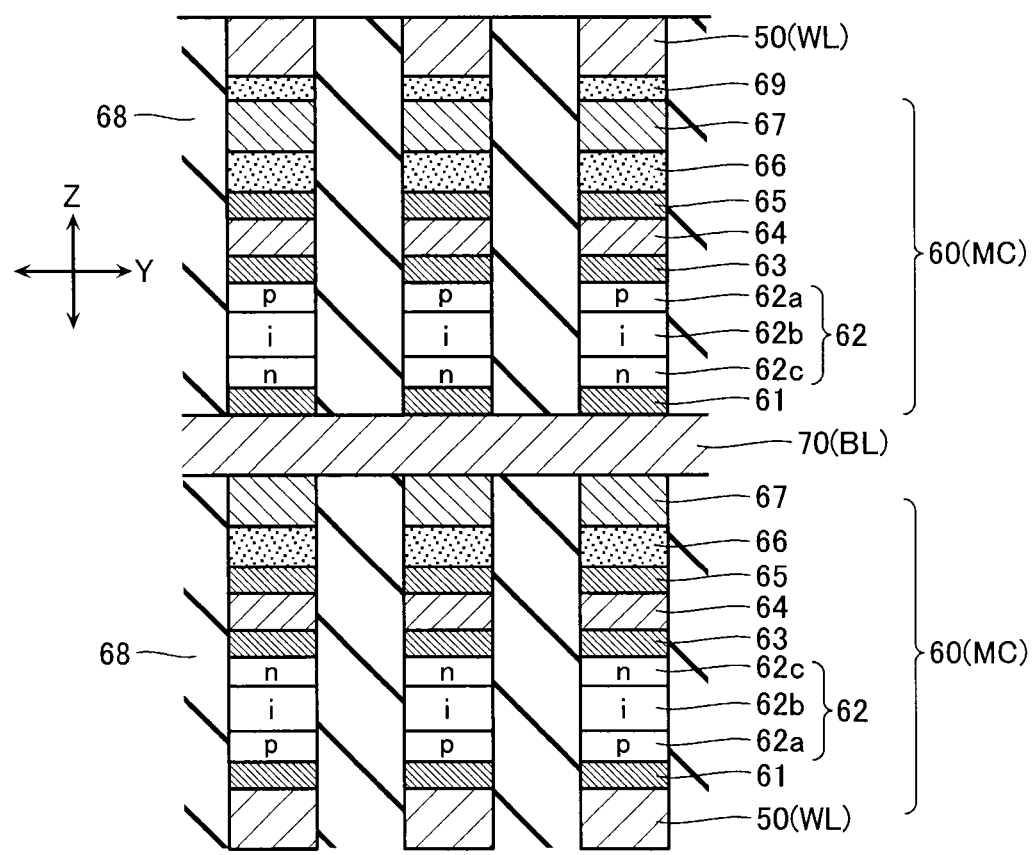
FIG. 12 is a sectional view illustrating a memory layer 60 according to a second embodiment.

Next, a semiconductor storage device according to a second embodiment is described. As illustrated in FIG. 12, the semiconductor storage device according to the second embodiment is formed substantially similarly to the semiconductor storage device according to the first embodiment, but differs in further including a liner layer 69 between the stopper layer 67 and the word line WL in a memory cell array 10 uppermost portion.

When performing etching during formation of the bit lines or word lines in the memory cell array uppermost portion, the uppermost layer of the stacking body becomes the above-described bit lines or word lines. Therefore, configuring the bit lines or word lines in the memory cell array uppermost portion to be in a "tensile" state at room temperature is thought to enable buckling in the memory cell array uppermost portion to be effectively suppressed.

Figure 13:
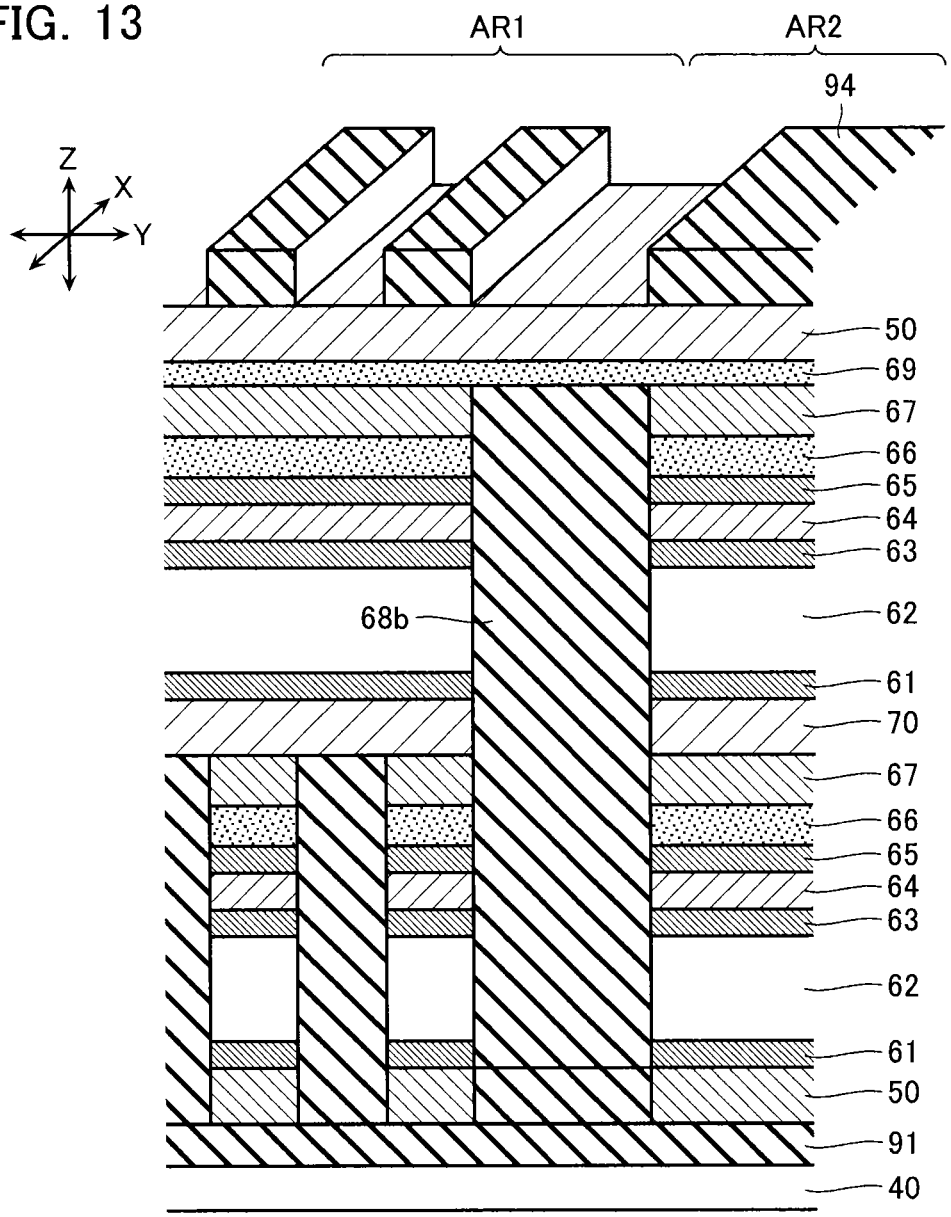
FIG. 13 is a sectional view of the semiconductor storage device in the manufacturing process according to the second embodiment.

Next, a method of manufacturing the semiconductor storage device according to the second embodiment is described. The method of manufacturing the semiconductor storage device according to the second embodiment is similar to that of the first embodiment to processes illustrated in FIG. 11. As illustrated in FIG. 13, formed on an upper surface of the stacking structure illustrated in FIG. 11 are the liner-layer-forming layer 69 and the first-wiring-layer-forming layer 50, and formed on an upper surface of the first-wiring-layer-forming layer 50 is a hard mask 94. The same material can be applied to the liner-layer-forming layer 69 as to the liner layer 66, and the hard mask 94 can be formed by a similar method to the hard mask 92.

The liner-layer-forming layer 69 and the first-wiring-layer-forming layer 50 are formed by a sputtering method. Now, the orientation of the first-wiring-layer-forming layer 50 is adjustable by forming the liner-layer-forming layer 69. The orientation of the first-wiring-layer-forming layer 50 can be further adjusted by adjusting the bias of sputtering during formation of the liner-layer-forming layer 69 or the first-wiring-layer-forming layer 50. The bias value of sputtering may be adjusted such that internal stress at room temperature of the first wiring layer 50 acts in the compressive direction. Such a bias value may be appropriately adjusted according to aspect ratio and so on of the stacked body after later-described etching.

Figure 14:
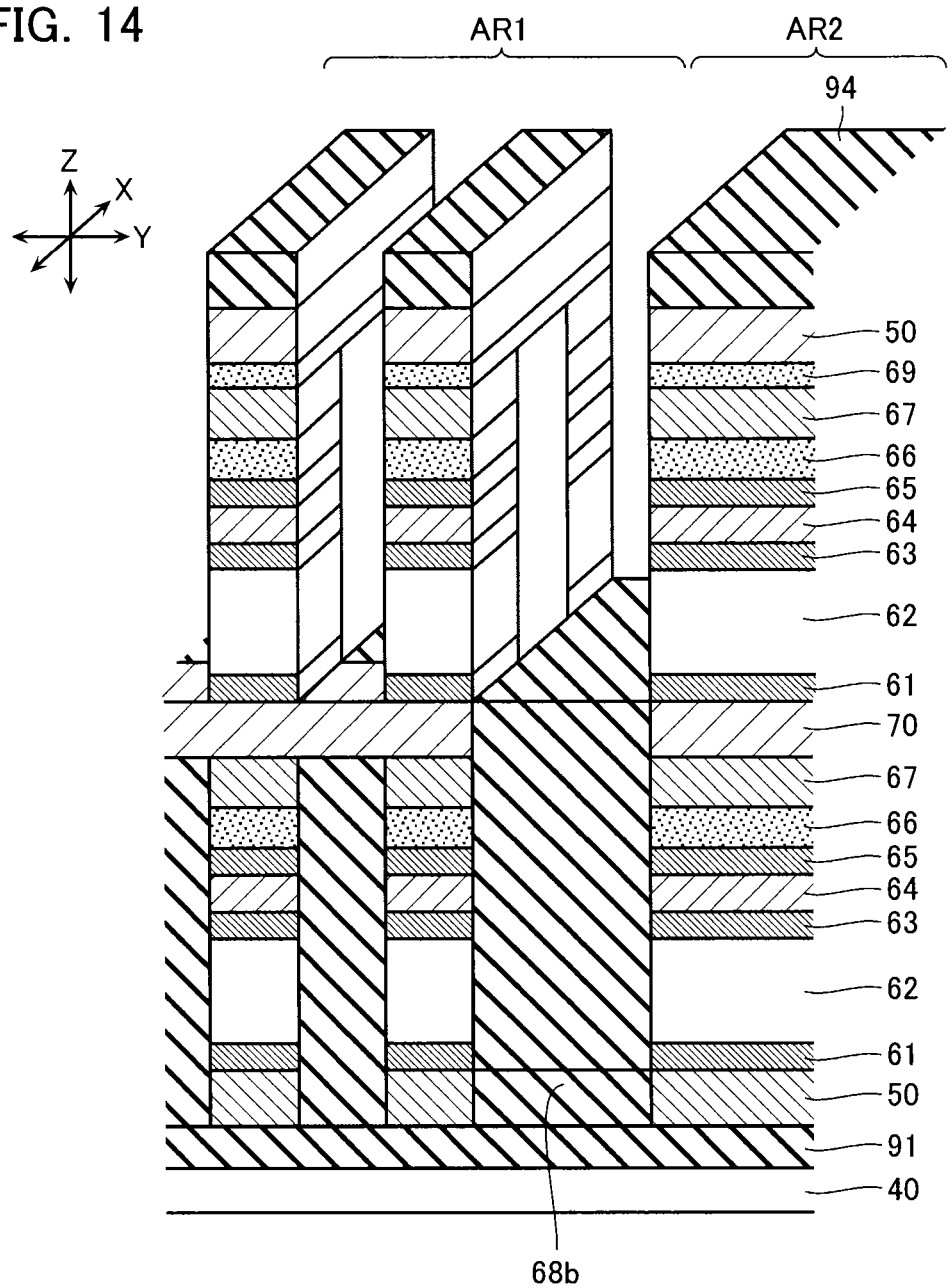
FIG. 14 is a sectional view of the semiconductor storage device in the manufacturing process according to the second embodiment.

Next, as illustrated in FIG. 14, etching is performed until the barrier-metal-layer-forming layers 61 are divided through the hard mask 94 by an RIE method. As a result, the liner layers 69 and the first wiring layers 50 are formed into the stripe shape extending in the X-direction while arrayed in the Y-direction at predetermined intervals. Moreover, the barrier metal layers 61, the diode layers 62, the lower electrode layers 63, the variable resistance layers 64, the upper electrode layers 65, the liner layers 66, and the stopper layers 67 are formed so as to be arranged in a matrix shape in the Y-direction and the X-direction at predetermined intervals in the lower layer of the first wiring layer 50. Then, the inter-layer insulator 68b is implanted to form the semiconductor storage device according to the second embodiment.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor storage device comprising:
    a first conductive layer;
    a variable resistance layer provided above the first conductive layer;
    an electrode layer contacting an upper surface of the variable resistance layer;
    a first liner layer contacting an upper surface of the electrode layer;
    a stopper layer contacting an upper surface of the first liner layer; and
    a second conductive layer provided above the stopper layer,
    the first liner layer being configured by a material having a property for canceling an influence of an orientation of a lower layer of the first liner layer, the property of the first liner layer being superior compared with that of the stopper layer, and
    the stopper layer being acted upon by an internal stress in a compressive direction at room temperature.

2. The semiconductor storage device according to claim 1, wherein
    the stopper layer is made of tungsten, and the first liner layer is made of amorphous silicon or tungsten silicide.

3. The semiconductor storage device according to claim 1, wherein
the second conductive layer is acted upon by an internal stress in a compressive direction at room temperature.

4. The semiconductor storage device according to claim 3, further comprising a second liner layer between the stopper layer and the second conductive layer.

5. The semiconductor storage device according to claim 4, wherein
the second conductive layer is made of tungsten, and
the second liner layer is made of amorphous silicon or tungsten silicide.

* * * * *